United States Patent [19]

Baues et al.

[11] 4,147,979

[45] Apr. 3, 1979

[54] MOVABLE PROBE CARRYING OPTICAL WAVEGUIDES WITH ELECTRO-OPTIC OR MAGNETO-OPTIC MATERIAL FOR MEASURING ELECTRIC OR MAGNETIC FIELDS

[75] Inventors: Peter Baues, Krailling; Hans Mahlein, Munich; Peter Moeckel, Munich; Achim Reichelt, Munich; Gerhard Winzer, Munich, all of Fed. Rep. of Germany

[73] Assignee: Siemens Aktiengesellschaft, Berlin & Munich, Fed. Rep. of Germany

[21] Appl. No.: 860,206

[22] Filed: Dec. 13, 1977

Related U.S. Application Data

[63] Continuation of Ser. No. 676,679, Apr. 14, 1976, abandoned.

[30] Foreign Application Priority Data

Apr. 16, 1975 [DE] Fed. Rep. of Germany ....... 2516619

[51] Int. Cl.² .................... G01R 33/02; G02B 5/14
[52] U.S. Cl. ........................... 324/244; 324/96; 350/96.13; 350/96.14
[58] Field of Search ............... 324/244, 96; 350/96.14, 350/96.13

[56] References Cited

U.S. PATENT DOCUMENTS

| 3,408,131 | 10/1968 | Kapany | 350/96 WG |
|---|---|---|---|
| 3,605,013 | 9/1971 | Yoshikawa | 324/96 |
| 3,662,263 | 5/1972 | Bensel | 324/96 |
| 3,679,974 | 7/1972 | Mollenbeck | 324/96 |
| 3,883,220 | 5/1975 | Taylor | 350/96 WG |

FOREIGN PATENT DOCUMENTS 1121423 7/1968 United Kingdom ...................... 324/96

OTHER PUBLICATIONS

Hall et al., Observation of Propagation Cut Off etc., Applied Physics Letters, vol. 17, No. 3, Aug. 1970, pp. 122–129.

*Primary Examiner*—Robert J. Corcoran
*Attorney, Agent, or Firm*—Hill, Gross, Simpson, Van Santen, Steadman, Chiara & Simpson

[57] ABSTRACT

A probe for the non-contact measurement of electric or magnetic field strengths has two wave guides provided on a substrate. One of the wave guides has a measurement portion consisting of an electro-optical material or a magneto-optical material in a region of a measurement zone. A magnetic or electric field changes the index of refraction of the measuring portion and the intensity of a light wave traveling through this portion of the wave guide is reduced. Comparison is then made between a standard intensity in the other wave guide and a reduced intensity in the light traveling through the wave guide measuring portion.

8 Claims, 3 Drawing Figures

MOVABLE PROBE CARRYING OPTICAL WAVEGUIDES WITH ELECTRO-OPTIC OR MAGNETO-OPTIC MATERIAL FOR MEASURING ELECTRIC OR MAGNETIC FIELDS

This is a continuation, of application Ser. No. 676,679, filed Apr. 14, 1976, now abandoned.

BACKGROUND OF THE INVENTION

1. Field of the Invention

The present invention relates to a probe for the non-contact measurement of electric or magnetic field strengths.

2. Description of the Prior Art

Reaction-free vectorial field strength measurements such as within hollow conductors or high voltage zones require spot probes. When a high field strength is measured in a high voltage zone, the risk of shock to the measuring personnel must be avoided.

SUMMARY OF THE INVENTION

It is an object of the present invention to provide a probe which eliminates measurement risks to operating personnel in high voltage areas.

It is a further object of this invention to provide a probe having at least one optical wave guide which, in a region of the measurement zone, is constructed of electro-optical or magneto-optical material.

In a preferred embodiment, the probe possesses two optical wave-guides which run parallel to one another, one of the optical wave-guides being comprised of electro-optical or magneto-optical material in the region of the measurement zone.

In another embodiment, one or several optical wave guides are, at least in the region of the measurement zone, connected to a substrate upon which is arranged an additional material. Within the measurement zone, the optical wave-guide, the additional material, the superstrate, or a combination of these components consist of electro-optical or magneto-optical material.

In accordance with the teachings of this invention, the probe exploits the change in optical properties of the wave-guides due to the influence of electric or magnetic fields. The field strength which is to be measured produces an optical signal which can be transmitted in an optical wave-guide or on a freely propagating laser beam. Such a signal cannot be adulterated by electric and magnetic interference fields during the transmission.

One advantage of the measuring probe is the use of integrated-optical elements having small dimensions which permit scanning of the field in point-like fashion. Due to the absence of metallic supply lines and contacts together with the small size of the probe, the reaction on the field to be measured is extremely small. In addition, in the measurement of high field strengths, risk to the measuring personnel is avoided due to the ideal insulation provided by the probe.

DESCRIPTION OF THE PREFERRED EMBODIMENTS

Figure 1:
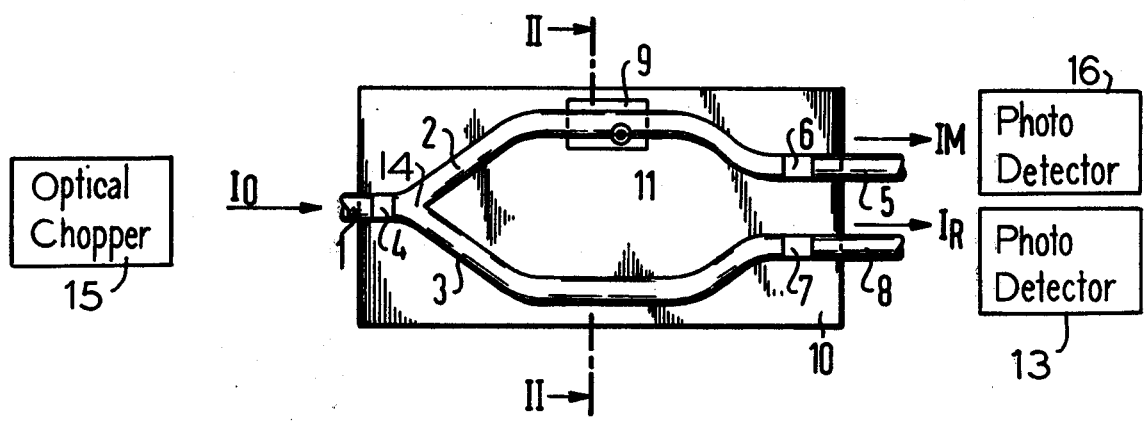
FIG. 1 is a plan view of a probe in accordance with the invention.
Figure 2:
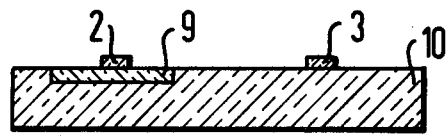
FIG. 2 is a cross-section along line II—II of FIG. 1.

In the Figures, a first optical wave-guide referenced 1 is provided within which a coherent, optical measurement wave having an intensity $I_O$ and emanating from a laser generator (not shown) runs in the direction of the arrow. This measurement wave is divided with a wave-guide fork 14, as a result of which a measurement sub-wave runs in the optical wave-guide 2 through the actual measurement zone 11 where the intensity of the subwave is influenced by the field which is to be measured, and a reference subwave runs in the optical wave-guide 3 and remains uninfluenced. The two sub-waves possessing the intensities $I_M$ and $I_R$ are subsequently guided with separate optical wave-guides 5 and 8 to a pair of photo-detectors 13 and 16 in which a difference signal between the two sub-waves is measured. Coupling components for the individual optical wave-guides are referenced 4, 6 and 7 and a substrate upon which the optical wave-guides are arranged is referenced 10.

In accordance with the invention, within the measurement zone 11 either the optical wave-guide 2, the substrate 10, an additional material 9, or a plurality of such components consist of electro-optical material such as $LiNbO_3$ or magneto-optical material such as $FeBO_3$. In the field-free areas, the wave is conducted in the wave-guide 2. To this end, the index of refraction must be $n_2 > n_s$ ($n_s$ = substrate index). In the field, either $n_2$ is reduced and/or $n_s$ is increased, so that a portion of the guided waves are output-coupled into the substrate 10 or the additional material, and thus the intensity $I_M$ is reduced. The measurement zone of the probe can be influenced by construction techniques such as crystal orientation, material selection, and geometric dimensioning, and also by the orientation of the probe in the field to be measured and the wave-length of the measuring light.

Figure 3:
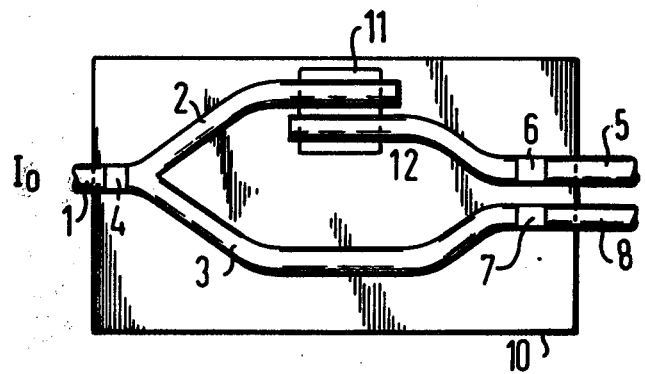
FIG. 3 shows a plan view of another embodiment.

Instead of being output-coupled into the substrate or additional material, the intensity of the measurement sub-wave, over-coupled into a further optical wave-guide, can serve as a measurement signal, as shown in FIG. 3. In this case, the optical wave-guide 2 terminates at the rear of the measurement zone 11, and another optical wave-guide 12 begins at a point directly in front of the measurement zone and runs for a short distance next to, over, or below the optical wave-guide 2.

It is particularly advantageous if the input intensity $I_O$ present in the optical wave-guide 1 is chopped by an optical chopper 15 in order to avoid interference light influences. The difference measurement not only eliminates the influence of intensity fluctuations in the input signal $I_O$, but also the influence of stray losses in the transmission of the output signal to the detector.

In a simpler embodiment, if the measurement conditions so permit, the fork circuit and thus the reference wave-guide 3 can be dispensed with.

Thus, the probe in accordance with the invention allows the measurement of electric and magnetic field strengths by optical signals transmission with a minimum reaction by the probe on the field to be measured. Furthermore, the insulation between the field and the operator is ideal. As the field strength creates a change in the index of refraction in the optical wave-guide probe, and guided light waves are scattered in various radiation and leakage-wave modes. A change in the intensity of the guided wave results which serves as a measuring signal.

Although various minor modifications may be suggested by those versed in the art, it should be understood that I wish to embody within the scope of the patent warranted hereon, all such embodiments as reasonably and properly come within the scope of my contribution to the art.

We claim as our invention:

1. A movable probe for a point-by-point scanning-like non-contact measurement of electric field strengths in a region of a measurement zone, comprising a first optical wave-guide member having a first index of refraction arranged on a movable substrate means of second index of refraction for movement into the electric field, said first index being greater than said second index, one of said first wave-guide member and substrate means being comprised of an electro-optical material means only in the region of the measurement zone, said electro-optical material means having an index of refraction which changes in the presence of the electric field for coupling light from the first wave guide into the substrate means, a second optical wave guide member of said first index of refraction arranged on said substrate means outside of said measurement zone, a common light input for each of said first and second wave guide members, and the first and second wave guide members and substrate means outside of the region of the measurement zone not having electro-optical material.

2. The probe of claim 1 in which said electro-optical material comprises $LiNbO_3$.

3. A movable probe for a point-by-point scanning-like non-contact measurement of electric field strengths in a region of a measurement zone, comprising: a first optical wave-guide member having a first index of refraction arranged on a movable substrate means of second index of refraction for movement into the electric field, said first index being greater than said second index, said substrate means having an additional material member of an index of refraction less than said first index arranged in said measuring zone between said first optical wave-guide member and substrate means, one of said first optical wave guide and additional material members being comprised of electro-optical material means only in the region of the measurement zone, said electro-optical material means having an index of refraction which changes in the presence of the electric field for coupling light from the first wave guide into the additional material member, a second optical wave guide member of said first index of refraction arranged on said substrate means outside of said measurement zone, a common light input for each of said first and second wave guide members, and the first and second wave guide members and substrate means outside of the region of the measurement zone not having electro-optical material.

4. A movable probe for a point-by-point scanning-like non-contact measurement of magnetic field strengths in a region of a measurement zone, comprising: a first optical wave-guide member having a first index of refraction arranged on a movable substrate means of second index of refraction for movement into the magnetic field, said first index being greater than said second index, one of said first wave-guide member and substrate means being comprised of a magneto-optical material means only in the region of the measurement zone, said magneto-optical material means having an index of refraction which changes in the presence of the magnetic field for coupling light from the first wave guide into the substrate means, a second optical wave guide member of said first index of refraction arranged on said substrate means outside of said measurement zone, a common light input for said first and second wave guide members and the first and second wave guide members and substrate means outside of the region of the measurement zone not having magneto-optical material.

5. The probe of claim 4 in which said magneto-optical member comprises $FeBO_3$.

6. A movable probe for a point-by-point scanning-like non-contact measurement of magnetic field strengths in a region of a measurement zone, comprising: a first optical wave-guide member having a first index of refraction arranged on a movable substrate means of second index of refraction for movement into the magnetic field, said first index being greater than said second index, said substrate means having an additional material member of an index of refraction less than said first index arranged in said measuring zone between said first optical wave-guide member and substrate means, one of said first optical wave guide and additional material members being comprised of magneto-optical material means only in the region of the measurement zone, said magneto-optical material means having an index of refraction which changes in the presence of the magnetic field for coupling light from the first wave guide into the additional material member, a second optical wave guide member of said first index of refraction arranged on said substrate means outside of said measurement zone, a common light input for said first and second wave guide members and the first and second wave guide members and substrate means outside of the region of the measurement zone not having magneto-optical material.

7. A movable probe for a point-by-point scanning-like non-contact measurement of electric field strengths in a region of a measurement zone, comprising:
   (a) a first optical wave guide member having a first index refraction arranged on a movable substrate means of second index of refraction for movement into the electric field, said first index being greater than said second index;
   (b) a second optical wave guide member of said first index of refraction arranged on said substrate means outsie of said measurement zone, and a common light input for each of said first and second wave guide members;
   (c) a third optical wave guide member having a portion parallel with said first wave guide member arranged in said measurement zone;
   (d) portions of the first wave guide and third wave guide members and substrate means being within the measurement zone and at least one of said first and third wave guide members and substrate means portions being comprised of an electro-optical material means only in the region of the measurement zone, said electro-optical material means having an index of refraction which changes in the presence of an electric field for coupling light from said first wave guide into the third wave guide and
   (e) the first, second and third wave guide members and substrate means outside of said measurement zone not having electro-optical material.

8. A movable probe for a point-by-point scanning-like non-contact measurement of magnetic field strengths in a region of a measurement zone, comprising:

(a) a first optical wave guide member having a first index of refraction arranged on a movable substrate means of second index of refraction for movement into the magnetic field, said first index being greater than said second index;

(b) a second optical wave guide member of said first index of refraction arranged on said substrate means outside of said measurement zone, and a common light input for each of said first and second wave guide members;

(c) a third optical wave guide member having a portion parallel with said first wave guide member arranged in said measurement zone;

(d) portions of the first wave guide and third wave guide members and substrate means being within the measurement zone and at least one of said first and third wave guide members and substrate means portions being comprised of a magneto-optical material means only in the region of the measurement zone, said magneto-optical material means having an index of refraction which changes in the presence of a magnetic field for coupling light from said first wave guide into the third wave guide and (e) the first, second and third wave guide members and substrate means outside of said measurement zone not having magneto-optical material.

* * * * *